United States Patent
Min

(10) Patent No.: US 11,828,812 B2
(45) Date of Patent: Nov. 28, 2023

(54) APPARATUS AND METHOD FOR DETECTING DEFECT OF BATTERY PACK

(71) Applicant: LG ENERGY SOLUTION, LTD., Seoul (KR)

(72) Inventor: Kyoung-Choon Min, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 107 days.

(21) Appl. No.: 17/617,056

(22) PCT Filed: Jul. 3, 2020

(86) PCT No.: PCT/KR2020/008764
§ 371 (c)(1),
(2) Date: Dec. 7, 2021

(87) PCT Pub. No.: WO2021/006571
PCT Pub. Date: Jan. 14, 2021

(65) Prior Publication Data
US 2022/0334189 A1    Oct. 20, 2022

(30) Foreign Application Priority Data
Jul. 10, 2019  (KR) .................. 10-2019-0083360

(51) Int. Cl.
*H02J 7/00*      (2006.01)
*H01M 10/42*   (2006.01)
(Continued)

(52) U.S. Cl.
CPC ......... *G01R 31/392* (2019.01); *G01R 31/388* (2019.01); *G01R 31/3842* (2019.01);
(Continued)

(58) Field of Classification Search
CPC .............. G01R 31/396; G01R 31/3842; G01R 31/364; G01R 31/392; G01R 31/74;
(Continued)

(56) References Cited

U.S. PATENT DOCUMENTS 5,853,908 A   12/1998  Okutoh
6,225,788 B1   5/2001  Kouzu et al.
(Continued)

FOREIGN PATENT DOCUMENTS

CN    1241305 A    1/2000
JP    6-57050 U    8/1994
(Continued)

OTHER PUBLICATIONS

Extended European Search Report for European Application No. 20836551.0 dated Jul. 15, 2022.
(Continued)

*Primary Examiner* — Lee E Rodak
*Assistant Examiner* — Trung Q Nguyen
(74) *Attorney, Agent, or Firm* — Birch, Stewart, Kolasch & Birch, LLP

(57) ABSTRACT

An apparatus for detecting a defect of a battery pack may disconnect a battery cell at which a defect is detected inside a battery pack to remove a risk factor that may occur from the corresponding battery cell. Risk factors that may cause explosions can be eliminated by discharging the battery cell at which a defect is detected. In addition, the recurrence of the risk factor can be prevented in advance by disconnecting the battery cell at which the defect is detected from the battery pack.

15 Claims, 4 Drawing Sheets

(51) Int. Cl.
*G01R 31/392* (2019.01)
*H01M 10/637* (2014.01)
*G01R 31/396* (2019.01)
*G01R 31/3842* (2019.01)
*G01R 31/388* (2019.01)
*H01M 10/48* (2006.01)

(52) U.S. Cl.
CPC ........ *G01R 31/396* (2019.01); *H01M 10/425* (2013.01); *H01M 10/4207* (2013.01); *H01M 10/4285* (2013.01); *H01M 10/482* (2013.01); *H01M 10/637* (2015.04); *H02J 7/0031* (2013.01); *H02J 7/0048* (2020.01); *H01M 2010/4271* (2013.01)

(58) Field of Classification Search
CPC ................ G01R 31/54; H01M 10/637; H01M 10/4207; H01M 10/425; H01M 50/20; H01M 10/052; H01M 10/4285; H01M 10/482; H01M 2010/4271; H02J 7/0048; H02J 7/00309; H02J 7/00302; H02J 7/0031; Y02E 60/10
USPC .................................................. 324/425–435
See application file for complete search history.

(56) References Cited

U.S. PATENT DOCUMENTS

| | | | |
|---|---|---|---|
| 6,344,728 B1 | 2/2002 | Kouzu et al. | |
| 6,411,063 B1 | 6/2002 | Kouzu et al. | |
| 2007/0188148 A1 | 8/2007 | Kawasumi et al. | |
| 2008/0074082 A1 | 3/2008 | Tae et al. | |
| 2010/0194339 A1 | 8/2010 | Yang et al. | |
| 2010/0268493 A1* | 10/2010 | Tae .................... | H01M 10/482 702/63 |
| 2011/0019326 A1 | 1/2011 | Odaohhara | |
| 2012/0056598 A1 | 3/2012 | Kim et al. | |
| 2014/0320070 A1 | 10/2014 | Nakamoto et al. | |
| 2015/0200559 A1* | 7/2015 | Im .................... | H02J 7/0029 307/18 |
| 2018/0191177 A1 | 7/2018 | Sundaraaman | |
| 2018/0198294 A1 | 7/2018 | Sheeks et al. | |
| 2019/0052257 A1 | 2/2019 | Song et al. | |
| 2019/0120878 A1 | 4/2019 | Kim et al. | |

FOREIGN PATENT DOCUMENTS

| | | |
|---|---|---|
| JP | 10-136581 A | 5/1998 |
| JP | 4341085 B2 | 10/2009 |
| JP | 2011-23317 A | 2/2011 |
| JP | 2011-120423 A | 6/2011 |
| JP | 2015-201313 A | 11/2015 |
| JP | 6229668 B2 | 11/2017 |
| JP | 6260106 B2 | 1/2018 |
| JP | 2018-54391 A | 4/2018 |
| KR | 10-0863956 B1 | 10/2008 |
| KR | 10-1174895 B1 | 8/2012 |
| KR | 10-2017-0116472 A | 10/2017 |
| KR | 10-2018-0037812 A | 4/2018 |
| KR | 10-2018-0081014 A | 7/2018 |
| KR | 10-2018-0119320 A | 11/2018 |
| KR | 10-1945900 B1 | 2/2019 |

OTHER PUBLICATIONS

International Search Report (PCT/ISA/210) issued in PCT/KR2020/008764 dated Oct. 29, 2020.
Lin et al., "Preventing Over-Charge/Over-Discharge/Short Circuit by Using Protective Circuit Safe use of Lithium Battery", Electronic Testing, No. 8. Aug. 5, 2006, pp. 24-29, with an English abstract.

* cited by examiner

APPARATUS AND METHOD FOR DETECTING DEFECT OF BATTERY PACK

TECHNICAL FIELD

The present application claims priority to Korean Patent Application No. 10-2019-0083360 filed on Jul. 10, 2019 in the Republic of Korea, the disclosures of which are incorporated herein by reference.

The present disclosure relates to an apparatus and method for detecting a defect of a battery pack, and more particularly, to an apparatus and method for detecting a defect of a battery cell provided in the battery pack and disconnecting the battery cell at which a defect is detected.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

In addition, various studies are being conducted to efficiently control the charging and discharging of a battery and reducing the risk of explosion of the battery. Patent Literature 1 discloses a battery pack capable of delaying damage, ignition and explosion caused by thermal runaway of a battery by operating a battery balancing circuit when a discharge switch provided to the battery pack malfunctions.

In Patent Literature 1, since the battery is discharged by operating the balancing circuit, it is possible to temporarily prevent accidents caused by battery overcharge. However, since the battery is continuously used inside the battery pack, there is a problem that the same problem may recur again.

(Patent Literature 1) KR 10-1945900 B1

DISCLOSURE

Technical Problem

The present disclosure is designed to solve the problems of the related art, and therefore the present disclosure is directed to providing an apparatus and method for detecting a defect of a battery pack, which may disconnect a battery cell at which a defect is detected inside a battery pack to remove a risk factor that may occur from the corresponding battery cell.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for detecting a defect of a battery pack including a battery cell, comprising: a fuse having a first connected to a first terminal of the battery cell in series and a second end connected to an electrode terminal of the battery pack; a monitor configured to measure at least one of voltage, current and temperature of the battery cell and determine whether the fuse is cut or remains intact; a discharge line including a discharge resistor having a first end connected in parallel to the first terminal of the battery cell, and a discharge switch having a first end connected to a second terminal of the battery cell and a second end connected to the other end of the discharge resistor; and a controller configured to receive a measurement result measured by the monitor and a determination result on whether the fuse is cut is not, estimate a state of charge (SOC) of the battery cell based on the received measurement result, determine based on the received measurement result and the estimated SOC whether a state of the battery cell is a normal state or a defective state, and control an operation state of the discharge switch to a turn-on state or a turn-off state according to the determined state of the battery cell and the determination result on whether the fuse is cut or not.

The fuse may be configured to be cut when the operation state of the discharge switch is a turn-on state.

The controller may be configured to determine that the state of the battery cell is a defective state and control the operation state of the discharge switch to a turn-on state, in response to the battery cell being determined based on the measurement result as being in at least one of an overcharge state and a high-temperature state higher than or equal to a threshold temperature.

In another aspect of the present disclosure, the apparatus for detecting a defect of a battery pack may further comprise a cooling element connected on the discharge line in series and configured to be operated to lower the temperature of the battery cell while the operation state of the discharge switch is being controlled to a turn-on state by the controller.

The controller may be configured to control the operation state of the discharge switch to a turn-off state, in response to the fuse being cut and the estimated SOC of the battery cell being lower than or equal to a preset lower limit value.

The controller may be configured to control the operation state of the discharge switch to a turn-on state, in response to the estimated SOC of the battery cell being higher than or equal to a preset upper limit value after the fuse is determined as being cut.

In still another aspect of the present disclosure, the apparatus for detecting a defect of a battery pack may further comprise:
  a main switch having a first end connected to a second end of the fuse and the other end connected to the electrode terminal of the battery pack; and
  a cut-off resistor having a first end connected between the fuse and the main switch and a second end connected between the discharge resistor and the discharge switch.

The discharge resistor may be configured to have a resistance smaller than that of the cut-off resistor.

The controller may be configured to control the operation state of the main switch to a turn-off state, in response to the state of the battery cell being determined as a defective state.

In still another aspect of the present disclosure, the apparatus for detecting a defect of a battery pack may further comprise an ammeter provided between the first end of the discharge resistor and a line to which the second end of the fuse and the first terminal of the battery cell are connected and configured to measure a current flowing in the discharge resistor.

The monitor may be configured to determine that the fuse is cut, in response to the current value measured by the ammeter being higher than or equal to a predetermined threshold value.

The controller may be configured to control the operation state of the main switch to a turn-on state, in response to the fuse being determined by the monitor as being cut, regardless of whether the battery cell is determined as a normal state.

In still another aspect of the present disclosure, the apparatus for detecting a defect of a battery pack may further comprise a fuse cutting module connected to the controller and configured to cut the fuse by including at least one of a heater for generating heat, a current applicator for applying a current to the fuse and a cutter for cutting the fuse when a cutting control signal is received from the controller.

The controller may be configured to output the cutting control signal, in response to the fuse not being cut and the state of the battery cell being determined as a defective state.

The battery pack may include a plurality of battery cells.

The fuse may be configured to be connected to the first terminal of a corresponding battery cell among the plurality of battery cells included in the battery pack.

The discharge line may be configured to be connected to each corresponding battery cell among the plurality of battery cells.

In still another aspect of the present disclosure, the apparatus for detecting a defect of a battery pack may further comprise a bypass switch connected in parallel to each corresponding battery cell among the plurality of battery cells and configured such that an operation state of the bypass switch is controlled to a turn-off state or a turn-on state by the controller.

The controller may be configured to select a battery cell, among the plurality of battery cells, as a target cell, which is determined as in a defective state or as a fuse corresponding thereto as being cut, control the operation state of the discharge switch included in the discharge line corresponding to the selected target cell to a turn-on state or a turn-off state according to the state of the selected target cell, and control the operation state of the bypass switch connected to the target cell in parallel to a turn-on state.

In still another aspect of the present disclosure, there is also provided a battery pack, comprising the apparatus for detecting a defect of a battery pack according to an aspect of the present disclosure.

In still another aspect of the present disclosure, there is also provided a method for detecting a defect of a battery pack, comprising: a measuring step of measuring at least one of voltage, current and temperature of a battery cell of the battery pack; a cutting determining step of determining whether a fuse is cut or remains intact; a battery cell state determining step of determining a state of the battery cell as a normal state or a defective state based on the measurement result measured in the measuring step; and a discharge switch operation controlling step of controlling an operation state of a discharge switch to a turn-on state or a turn-off state according to the determined state of the battery cell and the determination result on whether the fuse is cut or not.

Advantageous Effects

According to the present disclosure, there is an advantage that risk factors that may cause explosions can be eliminated by discharging the battery cell at which a defect is detected.

In addition, according to the present disclosure, there is an advantage that the recurrence of the risk factor can be prevented in advance by disconnecting the battery cell at which the defect is detected from the battery pack.

In addition, according to the present disclosure, since information on the battery cell disconnected from the battery pack since a defect is detected is provided, there is an advantage that the battery cell at which the defect is detected can be very easily identified and exchanged.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
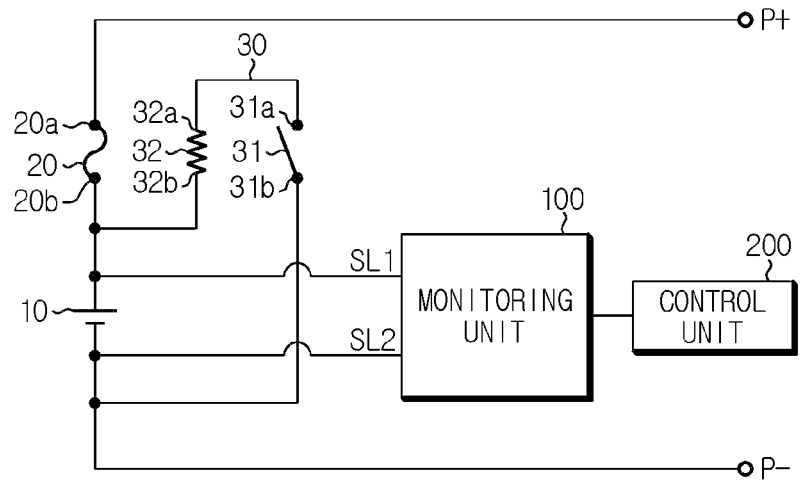
FIG. 1 is a diagram schematically showing an exemplary configuration of an apparatus for detecting a defect of a battery pack according to an embodiment of the present disclosure.

FIG. 1 is a diagram schematically showing an exemplary configuration of an apparatus for detecting a defect of a battery pack according to an embodiment of the present disclosure.

Referring to FIG. 1, the apparatus for detecting a defect of a battery pack according to an embodiment of the present disclosure may include a fuse 20, a monitoring unit 100, a discharge line 30, and a control unit 200. Here, the battery pack may include at least one battery cell 10. For example, if the battery pack includes a plurality of battery cells 10, the plurality of battery cells 10 may be connected in series and/or in parallel. Hereinafter, a case in which one battery cell 10 is included in the battery pack will be described.

One end of the fuse 20 may be connected in series to a first terminal of the battery cell 10. Here, the first terminal of the battery cell 10 may be a positive electrode terminal or a negative electrode terminal, and the second terminal may be a terminal having a polarity opposite to the first terminal. That is, one end of the fuse 20 may be connected to any one of a positive electrode terminal and a negative electrode terminal of the battery cell 10. Hereinafter, for convenience of explanation, the first terminal of the battery cell 10 will be described as a positive electrode terminal, and the second terminal will be described as a negative electrode terminal. For example, in the embodiment of FIG. 1, one end 20b of the fuse 20 may be connected to the positive electrode terminal of the battery cell 10.

The other end of the fuse 20 may be configured to be connected to an electrode terminal of the battery pack. Here, the electrode terminal of the battery pack to which the other end of the fuse 20 is connected may be a terminal having the same polarity as the first terminal of the battery cell 10 to which one end of the fuse 20 is connected. For example, in the embodiment of FIG. 1, one end 20b of the fuse 20 may be connected to the first terminal of the battery cell 10, and the other end 20a of the fuse 20 may be connected to the positive electrode terminal (P+) of the battery pack.

The fuse 20 included in the apparatus for detecting a defect of a battery pack according to an embodiment of the present disclosure may be fused to cut its wiring when overcurrent flows, or may be cut when a certain level of heat is introduced thereto.

The monitoring unit 100 may measure at least one of voltage, current and temperature of the battery cell 10.

For example, referring to FIG. 1, the monitoring unit 100 may be connected to the battery cell 10 through a plurality of sensing lines SL1 and SL2. The monitoring unit 100 may measure the voltage of the battery cell 10 by measuring the voltage at both ends of the battery cell 10 through the plurality of sensing lines SL1 and SL2 and calculating the difference between the measured voltages at both ends of the battery cell 10. In addition, the monitoring unit 100 may measure the temperature of the battery cell 10 through a temperature sensor attached to the battery cell 10. In addition, although not shown in FIG. 1, a sensing resistor is provided to the first terminal or the second terminal side of the battery cell 10, and the monitoring unit 100 may measure the voltage at both ends of the sensing resistor. In addition, the monitoring unit 100 may measure the current output from the battery cell 10 or the current applied to the battery cell 10 by calculating the difference between the measured voltages at both ends of the sensing resistor.

In addition, the monitoring unit 100 may be configured to determine whether the fuse 20 is cut or not.

Here, the determination on whether the fuse 20 is cut or not may mean determining whether the fuse 20 is already cut or not. For example, the monitoring unit 100 may determine whether the fuse 20 is cut or not by measuring the voltage at both ends 20a and 20b of the fuse 20 and calculating a potential difference between both ends 20a and 20b of the fuse 20. As another example, the monitoring unit 100 may determine whether the fuse 20 is cut or not by measuring the current flowing between the first terminal of the battery cell 10 and one end 20b of the fuse 20 or the current flowing between the other end 20a of the fuse 20 and the positive electrode terminal (P+) of the battery pack.

The discharge line 30 may be configured to include a discharge resistor 32 and a discharge switch 31. Specifically, the discharge resistor 32 may be configured such that one end 32b is connected to the first terminal of the battery cell 10. In addition, one end 31b of the discharge switch 31 may be connected to the second terminal of the battery cell 10, and the other end 31a of the discharge switch 31 may be connected to the other end 32a of the discharge resistor 32. Hereinafter, an embodiment in which the discharge resistor 32 is one resistor will be described, but the discharge resistor 32 may also be a composite resistor in which a plurality of resistors are connected in series and/or in parallel.

For example, in the embodiment of FIG. 1, the discharge line 30 may include the discharge resistor 32 and the discharge switch 31, so that the discharge resistor 32 and the discharge switch 31 are connected in series with each other on the discharge line 30. In addition, both ends of the discharge line 30 may be connected to both ends of the battery cell 10, so that the discharge resistor 32 and the discharge switch 31 provided on the discharge line 30 are connected in parallel to the battery cell 10.

In this configuration, if the fuse 20 is cut by overcurrent or heat and the operation state of the discharge switch 31 is shifted to a turn-on state, the battery cell 10 may be discharged through the discharge line 30, particularly the discharge resistor 32 of the discharge line 30.

The control unit 200 may receive a measurement result measured by the monitoring unit 100 and a determination result on whether the fuse 20 is cut or not. For example, the control unit 200 and the monitoring unit 100 may be connected in a wired and/or wireless manner, and the control unit 200 may receive the measurement result on at least one of the voltage, current and temperature of the battery cell 10 measured by the monitoring unit 100. Also, the control unit 200 may receive the determination result on whether the fuse 20 is cut or not, determined by the monitoring unit 100.

The control unit 200 may estimate a state of charge (SOC) of the battery cell 10 based on the received measurement result. For example, the control unit 200 may estimate the SOC of the battery cell 10 based on the received voltage of the battery cell 10, and may also estimate the SOC of the battery cell 10 by integrating an amount of charging current applied to the battery cell 10 for a certain period of time.

The control unit 200 may determine the state of the battery cell 10 as a normal state or a defective state based on the received measurement result and the estimated SOC.

For example, if the estimated SOC of the battery cell 10 is higher than or equal to a preset upper limit value, the control unit 200 may determine the state of the battery cell 10 as a defective state. That is, if the battery cell 10 has an excessive SOC, the control unit 200 may determine the state of the battery cell 10 as a defective state.

Conversely, even when the estimated SOC of the battery cell 10 is lower than or equal to the preset lower limit value, the control unit 200 may determine the state of the battery cell 10 as a defective state. That is, if the battery cell 10 is in an overdischarge state, the control unit 200 may determine the state of the battery cell 10 as a defective state.

In addition, if the temperature of the battery cell 10 measured by the monitoring unit 100 is higher than or equal to a preset threshold temperature, the control unit 200 may determine the state of the battery cell 10 as a defective state. That is, if the battery cell 10 is in a high-temperature state beyond an appropriate level, the control unit 200 may determine the state of the battery cell 10 as a defective state.

The control unit 200 may be configured to control the operation state of the discharge switch 31 to a turn-on state or a turn-off state according to the determined state of the battery cell 10 and the determination result on whether the fuse 20 is cut or not.

For example, if the state of the battery cell 10 is determined as a normal state, the control unit 200 may maintain the operation state of the discharge switch 31 as a turn-off state. Conversely, if the state of the battery cell 10 is determined to be a defective state, the control unit 200 may control the operation state of the discharge switch 31 to a turn-on state or a turn-off state.

Preferably, when the battery cell 10 is in a defective state, the control unit 200 may first determine whether the SOC of the battery cell 10 is in a dangerous level. For example, if the SOC of battery cell 10 is 70% or above, the control unit 200 may determine that the SOC of the battery cell 10 is in a dangerous level.

If the SOC of battery cell 10 is determined as being in a dangerous level, the control unit 200 may control the operation state of the discharge switch 31 to a turn-on state. If the state of the battery cell 10 is a defective state but the SOC of the battery cell 10 does not reach the dangerous level, the control unit 200 may control or maintain the operation state of the discharge switch 31 as a turn-off state. That is, when the state of the battery cell 10 is an overdischarge state, even though the state of the battery cell 10 is a defective state, the operation state of the discharge switch 31 may be controlled or maintained as a turn-off state.

For example, in the embodiment of FIG. 1, if the operation state of the discharge switch 31 is controlled to a turn-on state by the control unit 200, the battery cell 10 may be electrically connected with the discharge switch 31 and the discharge resistor 32 provided on the discharge line 30. Thus, the battery cell 10 may be discharged.

Since the apparatus for detecting a defect of a battery pack according to an embodiment of the present disclosure determines whether the battery cell 10 is in a defective state based on the voltage and temperature of the battery cell 10, it has an advantage that a defect of the battery pack including the corresponding battery cell 10 is detected.

In addition, since the apparatus for detecting a defect of a battery pack according to an embodiment of the present disclosure discharges the battery cell 10 in a defective state through the discharge line 30, energy (remaining capacity) in the battery cell 10 may be consumed. In this case, since the energy in the battery cell 10 is lowered, there is an advantage that unexpected accidents such as ignition or explosion may be prevented.

The control unit 200 may be implemented in hardware by using at least one of ASICs (Application specific integrated circuits), DSPs (Digital signal processors), DSPDs (Digital signal processing devices), PLDs (Programmable logic devices), FPGAs (Field programmable gate arrays), microprocessors, and electrical units for performing other functions. The control unit 200 may include a memory. The memory stores data, commands and software required for overall operations of the apparatus, and may include at least one type of storage media selected from a flash memory type, hard disk type, an SSD type (Solid State Disk type), an SDD type (Silicon Disk Drive type), Multimedia card micro type, RAM (Random access memory), SRAM (Static random access memory), ROM (Read-only memory), EEPROM (Electrically erasable programmable) and PROM (Programmable read-only memory).

The fuse 20 may be configured to be cut when the operation state of the discharge switch 31 is a turn-on state.

As described above, the fuse 20 may be cut by heat introduced thereto. If the operation state of the discharge switch 31 is a turn-on state, the battery cell 10 may be discharged through the discharge line 30. While discharging the battery cell 10 through the discharge line 30, the current output from the battery cell 10 passes through the discharge resistor 32, and heat may be generated at the discharge resistor 32. In addition, the heat generated from the discharge resistor 32 may be introduced to the fuse 20. To this end, the discharge resistor 32 may be positioned adjacent to the fuse 20 so that enough heat to fuse the fuse 20 is applied to the fuse 20. Therefore, if the operation state of the discharge switch 31 is a turn-on state, the fuse 20 may be cut by the heat generated from the discharge resistor 32.

The control unit 200 may determine the state of the battery cell 10 as a defective state, if the battery cell 10 is determined as being in at least one of an excessive SOC state and a high-temperature state over a threshold temperature based on the measured measurement result.

For example, since the electrolyte contained in the battery cell 10 is sensitive to heat, if a strong current flows in the battery cell 10 or the battery cell 10 is exposed to a high temperature environment, a chemical reaction may occur in the battery cell 10 according to the movement of electrons and gas or heat may be generated. The generated gas or heat may cause a swelling phenomenon in which the battery cell 10 swells, or ignition or explosion may occur.

In addition, if the battery cell 10 is in an excessive SOC state, a lithium plating phenomenon in which lithium is deposited may occur, degradation of the battery cell 10 is accelerated, and ignition or explosion may occur.

Accordingly, the control unit 200 may be configured to control the operation state of the discharge switch 31 to a turn-on state if the battery cell 10 is in an excessive SOC state and/or a high-temperature state.

If the apparatus for detecting a defect of a battery pack according to an embodiment of the present disclosure is used, when the fuse 20 is not cut by external factors, the fuse 20 may be cut in the process of discharging the battery cell 10 through the discharge line 30. Therefore, the configuration required for cutting the fuse 20 and discharging the battery cell 10 may be simplified, and the time required therefor may be reduced.

In addition, if the battery cell 10 is in an excessive SOC state and/or a high-temperature state, the apparatus for detecting a defect of a battery pack according to an embodiment of the present disclosure consumes the remaining capacity inside the battery cell 10, thereby lowering the internal energy of the battery cell 10 and thus preventing accidents such as ignition or explosion.

The apparatus for detecting a defect of a battery pack according to an embodiment of the present disclosure may further include a cooling unit for lowering the temperature of the battery cell 10.

The cooling unit is connected in series on the discharge line 30, and may be operated by the control unit 200 while the operation state of the discharge switch 31 is controlled to a turn-on state, thereby lowering the temperature of the battery cell 10.

Referring to FIG. 1, if the operation state of the discharge switch 31 is controlled as a turn-on state so that the battery cell 10 is discharged through the discharge line 30, heat may be generated by a chemical reaction inside the battery cell 10. Also, heat may be generated while a current is passing through the discharge resistor 32. Thus, there is a risk that the temperature of the battery cell 10 is further increased by heat and resistance heat caused by a chemical reaction generated during the discharge process. Therefore, in order to prevent an accident that may occur due to the increase in temperature of the battery cell 10, the cooling unit may be provided.

For example, the cooling unit may be configured using a fan. The fan is connected in series on the discharge line 30, and if the operation state of the discharge switch 31 is controlled to a turn-on state, the fan may be operated by receiving a current from the battery cell 10. In this case, the battery cell 10 may be cooled and discharged simultaneously.

As another example, the cooling unit may be configured using a thermoelectric element. The thermoelectric element is provided to the discharge line 30 and may receive a current from the battery cell 10. As the current is applied to both terminals of the thermoelectric element, the terminal at which an endothermic reaction occurs may contact the battery cell 10. In this case, the battery cell 10 may be cooled and discharged simultaneously.

In the above, the fan and the thermoelectric element have been described as examples of the cooling unit, but any cooling unit capable of lowering the temperature of the battery cell 10 may be used without limitation.

That is, since the apparatus for detecting a defect of a battery pack according to an embodiment of the present disclosure may include the cooling unit provided on the discharge line 30, it is possible to simultaneously discharge and cool the battery cell 10. Therefore, since the remaining capacity and temperature of the battery cell 10 may be simultaneously lowered, there is an advantage that the state of the battery cell 10 may come to a stable state more quickly.

The control unit 200 may be configured to control the operation state of the discharge switch 31 to a turn-off state, if the fuse 20 is cut and the SOC of the battery cell 10 is lower than or equal to the preset lower limit value. Here, the preset lower limit value is a reference value for determining whether the battery cell 10 is overdischarged, and may be stored in a memory of the control unit 200 or the like in advance.

In general, the overdischarge state means a state in which the SOC of the battery cell 10 is lowered to the preset lower limit value or below, and if the battery cell 10 is overdischarged, various problems may occur. For example, if the battery cell 10 is overdischarged, a separator may be damaged by lithium precipitation, which may cause ignition and explosion. Accordingly, when the battery cell 10 is in an overdischarge state, the control unit 200 may control the operation state of the discharge switch 31 to a turn-off state, so that the battery cell 10 is not discharged through the discharge line 30.

For example, it is assumed that the preset lower limit value is set to 50%. The control unit 200 may continuously estimate the SOC of the battery cell 10. If the estimated SOC of the battery cell 10 is lower than or equal to 50%, the control unit 200 may control or maintain the operation state of the discharge switch 31 as a turn-off state to prevent the battery cell 10 from being overcharged.

Meanwhile, if the fuse 20 is not cut even though the battery cell 10 is determined as in an overdischarge state, the control unit 200 may cut the fuse 20 by controlling the operation state of the discharge switch 31 to a turn-on state. In addition, the control unit 200 may prevent the battery cell 10 from being discharged by controlling the operation state of the discharge switch 31 to a turn-off state.

That is, since the apparatus for detecting a defect of a battery pack according to an embodiment of the present disclosure cuts the fuse 20 connected to the battery cell 10 in a defective state and lowers the SOC thereof, there is an advantage that secondary accidents caused by the battery cell 10 in a defective state can be prevented in advance.

The control unit 200 may be configured to control the operation state of the discharge switch 31 to a turn-on state, if the SOC of the battery cell 10 is greater than or equal to the preset upper limit value after the fuse 20 is determined as being cut.

For example, it is assumed that the preset upper limit value is set to 70%. If the SOC of the battery cell 10 is 70% or above, the control unit 200 may determine that the energy of the battery cell 10 is in a dangerous level. The control unit 200 may discharge the battery cell 10 by controlling the operation state of the discharge switch 31 to a turn-on state in order to lower the energy of the battery cell 10. During the discharging process, the monitoring unit 100 may continuously measure the voltage of the battery cell 10, and the control unit 200 may estimate the SOC of the battery cell 10 based on the measurement result measured by the monitoring unit 100. When the SOC of the battery cell 10 is lowered to the preset lower limit value or below, the control unit 200 may control the discharge switch 31 to a turn-off state to prevent an accident caused by overdischarge of the battery cell 10.

When the operation state of the discharge switch 31 is controlled to a turn-on state, the battery cell 10 and the discharge line 30 are electrically connected, and the current output from the battery cell 10 may be consumed by the discharge resistor 32. In addition, if the SOC of the battery cell 10 is lowered to the preset lower limit value or below, the control unit 200 may control the operation state of the discharge switch 31 to a turn-off state.

The apparatus for detecting a defect of a battery pack according to an embodiment of the present disclosure may continuously estimate the SOC of the battery cell 10 even in the process of discharging the battery cell 10 through the discharge line 30 to prevent the battery cell 10 from being overdischarged. In this case, an unexpected accident caused by overdischarge of the battery cell 10 can be prevented in advance.

Figure 2:
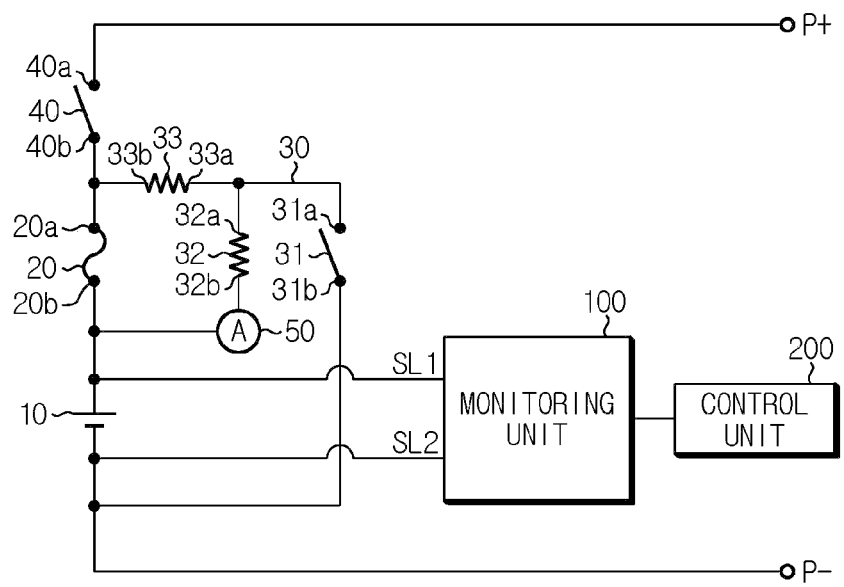
FIG. 2 is a diagram schematically showing another exemplary configuration of the apparatus for detecting a defect of a battery pack according to an embodiment of the present disclosure.

Hereinafter, the apparatus for detecting a defect of a battery pack according to an embodiment of the present disclosure will be described with reference to FIG. 2. FIG. 2 is a diagram schematically showing another exemplary configuration of the apparatus for detecting a defect of a battery pack according to an embodiment of the present disclosure. In describing the apparatus for detecting a defect of a battery pack as shown in FIG. 2, the features identical to those of the apparatus for detecting a defect of a battery pack as shown in FIG. 1 will not be described in detail, and only features different therefrom will be described in detail.

Referring to FIG. 2, the apparatus for detecting a defect of a battery pack according to an embodiment of the present disclosure may further include a main switch 40 and a cut-off resistor 33.

The main switch 40 may be provided on a large current path through which the charging/discharging current of the battery pack flows. In particular, one end 40b of the main switch 40 may be connected to the other end 20a of the fuse 20, and the other end 40a of the main switch 40 may be connected to the electrode terminal of the battery pack. Preferably, one end 40b of the main switch 40 may be connected in series to the other end 20a of the fuse 20, and the other end 40a of the main switch 40 may be connected in series to the positive electrode terminal (P+) of the battery pack. That is, the main switch 40 may be provided on a large current path between the fuse 20 and the electrode terminal of the battery pack.

For example, as shown in FIG. 2, it is assumed that the other end 40a of the main switch 40 is connected to the positive electrode terminal (P+) of the battery pack. If the operation state of the main switch 40 is a turn-off state, the fuse 20 and the positive electrode terminal (P+) of the battery pack may be disconnected. Conversely, if the operation state of the main switch 40 is a turn-on state, the fuse 20 and the positive electrode terminal (P+) of the battery pack may be electrically connected. Therefore, depending on the operation state of the main switch 40, the positive electrode terminal of battery cell 10 and the positive electrode terminal (P+) of the battery pack may be connected or disconnected.

One end 33b of the cut-off resistor 33 may be connected between the fuse 20 and the main switch 40, and the other end 33a of the cut-off resistor 33 may be connected between the discharge resistor 32 and the discharge switch 31. That is, one end 33b of the cut-off resistor 33 may be connected on a line to which the other end 20a of the fuse 20 and one end 40b of the main switch 40 are connected, and the other end 33a of the cut-off resistor 33 may be connected on a line to which the other end 32a of the discharge resistor 32 and the other end 31a of the discharge switch 31 are connected.

Referring to FIG. 2, the cut-off resistor 33 may be connected between the other end 20a of the fuse 20 and the other end 32a of the discharge resistor 32.

Preferably, the resistance of the cut-off resistor 33 may be greater than the resistance of the discharge resistor 32. For example, if the operation state of the main switch 40 is a turn-off state and the operation state of the discharge switch 31 is a turn-on state, the current flowing from the positive electrode terminal of the battery cell 10 may not pass through the cut-off resistor 33 but may be applied to the negative electrode terminal of the battery cell 10 through the discharge resistor 32.

According to this configuration, by allowing a current to flow through the discharge resistor 32, it is possible not only to discharge the battery cell 10 but also to cut the fuse 20 by the heat generated by the current flowing through the discharge resistor 32.

The resistance of the cut-off resistor 33 may be greater than the internal resistance of the discharge switch 31. For example, if the operation state of the discharge switch 31 is a turn-on state, the current output from the battery cell 10 may pass through the discharge resistor 32. After that, the current passing through the discharge resistor 32 may pass through the discharge switch 31 and be applied to the second terminal of the battery cell 10. Therefore, if the operation state of the discharge switch 31 is a turn-on state, the battery cell 10 can be effectively discharged.

According to this configuration, even if the fuse 20 is cut and the operation state of the main switch 40 is a turn-on state, the current output from the battery cell 10 may not flow to the electrode terminal of the battery pack but may flow toward the discharge switch 31. Therefore, there is an advantage that the operation state of the main switch 40 does not necessarily need to be controlled to a turn-off state.

The apparatus for detecting a defect of a battery pack according to an embodiment of the present disclosure may disconnect the electrode terminal of the battery pack and the battery cell 10 through the main switch 40, so there is an advantage that the apparatus may flexibly cope with the state of the battery cell 10.

In addition, the apparatus for detecting a defect of a battery pack may control the path of current through the cut-off resistor 33. Therefore, it is possible to prevent the current from being consumed while passing through the resistor, thereby increasing the charging and discharging efficiency.

Meanwhile, the discharge resistor 32 may be configured to have a resistance greater than the internal resistance of the fuse 20.

For example, the case where the fuse 20 is not cut and the operation state of the main switch 40 is a turn-on state will be described. The current output from the battery cell 10 may flow into the fuse 20, which has a smaller resistance than the discharge resistor 32. Therefore, the current output from the battery cell 10 may not flow to the path where the discharge resistor 32 is located, but flow to the large current path of the battery pack, namely toward the positive electrode terminal (P+) of the battery pack.

Conversely, in a situation where a charging current is applied from the positive electrode terminal (P+) of the battery pack, due to the cut-off resistor 33 and the discharge resistor 32, the charging current may be applied to the battery cell 10 through the fuse 20.

Also, the resistance of the discharge resistor 32 may be smaller than the resistance of the cut-off resistor 33.

For example, it is assumed that the operation state of the main switch 40 is a turn-off state and the operation state of the discharge switch 31 is a turn-on state. In this case, as described above, the battery cell 10 and the discharge line 30 may be connected so that the battery cell 10 is discharged. Since the resistance of the discharge resistor 32 is smaller than the resistance of the cut-off resistor 33, the current output from the battery cell 10 may not flow to the cut-off resistor 33 but may pass through the discharge resistor 32. Also, the current passing through the discharge resistor 32 may be applied to the second terminal of the battery cell 10 through the discharge switch 31. In addition, the heat generated by the discharge resistor 32 may be applied to the fuse 20. Therefore, if the operation state of the discharge switch 31 is a turn-on state, the fuse 20 may be cut by the heat generated from the discharge resistor 32.

If the apparatus for detecting a defect of a battery pack according to an embodiment of the present disclosure is used, the fuse 20 may be cut in the process of discharging the battery cell 10 through the discharge line 30. Accordingly, the configuration required for cutting the fuse 20 and discharging the battery cell 10 may be simplified, and the time required therefor may be reduced.

The control unit 200 may be configured to control the operation state of the main switch 40 to a turn-off state, if the state of the battery cell 10 is determined as a defective state.

First, the case where the fuse 20 is cut will be described. The control unit 200 may determine the state of the battery cell 10 as a normal state or a defective state based on the measurement result measured by the monitoring unit 100. If the battery cell 10 is in a defective state, the control unit 200 first controls the operation state of the main switch 40 to a turn-off state, thereby disconnecting the battery cell 10 in a defective state and the electrode terminal of the battery pack. After that, the control unit 200 may control the operation state of the discharge switch 31 based on the SOC and/or temperature of the battery cell 10. For example, if the SOC of the battery cell 10 is lower than or equal to the preset lower limit value, the control unit 200 may maintain the operation state of the discharge switch 31 as a turn-off state. Conversely, if the SOC of the battery cell 10 is higher than or equal to the preset upper limit value, the control unit 200 may control the operation state of the discharge switch 31 to a turn-on state to discharge the battery cell 10.

Next, the case in which the fuse 20 is not cut but the state of the battery cell 10 is determined as a defective state will be described. If the battery cell 10 is in a defective state, the control unit 200 first controls the operation state of the main switch 40 to a turn-off state, thereby disconnecting the battery cell 10 in a defective state and the electrode terminal of the battery pack. In addition, the control unit 200 may control the operation state of the discharge switch 31 to a turn-on state, thereby cutting the fuse 20 by the resistance heat generated from the discharge resistor 32. After the fuse 20 is cut, the control unit 200 may estimate the SOC of the battery cell 10 again. If the estimated SOC is lower than or equal to the preset lower limit value, the control unit 200 may control the operation state of the discharge switch 31 to a turn-off state to prevent the battery cell 10 from being overdischarged.

Therefore, the apparatus for detecting a defect of a battery pack according to an embodiment of the present disclosure may disconnect the battery cell 10 in a defective state from an external device through the main switch 40. Accordingly, there is an advantage that the battery cell 10 in a defective state may be prevented from being connected to an external device and thus being charged or discharged.

In addition, the apparatus for detecting a defect of a battery pack according to an embodiment of the present disclosure first disconnects the battery cell 10 from an external device and then takes flexible measures according to the state of the battery cell 10, so there is an advantage of preventing secondary accidents such as ignition and/or explosion caused by the battery cell 10.

The apparatus for detecting a defect of a battery pack according to an embodiment of the present disclosure may further include an ammeter 50 provided on the discharge line 30 and configured to measure a current applied to the discharge resistor 32.

For example, referring to FIG. 2, the ammeter 50 may be provided between one end 32b of the discharge resistor 32 and a line to which one end 20b of the fuse 20 and the first terminal of the battery cell 10 are connected and configured to measure a current applied to the discharge resistor 32. Alternatively, the ammeter 50 may be provided between the discharge resistor 32 and a line to which the cut-off resistor 33 and the discharge switch 31 are connected and configured to measure a current applied to the discharge resistor 32.

The monitoring unit 100 may be configured to determine that the fuse 20 is cut, if a current value for the current measured by the ammeter 50 is greater than or equal to a predetermined threshold value.

Referring to FIG. 2, if the fuse 20 is cut, the current output from the battery cell 10 may be applied to the discharge resistor 32. Therefore, if the current measured by the ammeter 50 is greater than or equal to the predetermined threshold value set in advance based on the current output from the battery cell 10, the monitoring unit 100 may determine that the fuse 20 is cut.

For example, in a discharge situation where the main switch 40 and the discharge switch 31 are controlled in a turn-on state, if the fuse 20 is not cut, current may substantially not flow through the discharge resistor 32. If it is measured that a current greater than 0, for example 1A or above, flows through the ammeter, it may be regarded that the fuse 20 is cut and the current output from the battery cell 10 is applied to the discharge resistor 32. Therefore, in this case, the monitoring unit 100 may determine that the fuse 20 is cut, based on the current value measured by the ammeter 50.

If it is determined that the fuse 20 is cut by the monitoring unit 100, the control unit 200 may be configured to discharge the battery cell 10 by controlling the operation state of the discharge switch 31 to a turn-on state. At this time, since the resistance of the cut-off resistor 33 is greater than the internal resistance of the discharge switch 31, the current passing through the discharge resistor 32 may be applied to the discharge switch 31, not to the main switch 40.

The apparatus for detecting a defect of a battery pack according to an embodiment of the present disclosure has an advantage of quickly determining whether the fuse 20 is cut or not.

The control unit 200 be configured to control the operation state of the main switch 40 to a turn-on state, if it is determined that the battery cell 10 is in a normal state but the fuse 20 is disconnected by the monitoring unit 100.

Preferably, if it is determined that the fuse 20 is cut, the control unit 200 may be configured to control (change or maintain) the operation state of the discharge switch 31 to a turn-off state according to the state of the battery cell 10.

For example, the fuse 20 may be cut due to external factors such as an overcurrent introduced from the outside or an impact applied to the battery pack. In this case, if the state of battery cell 10 is a normal state, it may not be desirable to discharge the battery cell 10 through the discharge line 30.

In order to cope with such an exceptional situation, if it is determined that the fuse 20 is cut, the control unit 200 may first determine whether the state of the battery cell 10 is a normal state or a defective state.

For example, if the state of battery cell 10 is a normal state, the control unit 200 may not control the discharge switch 31 to a turn-on state to discharge the battery cell 10 but control the main switch 40 to a turn-on state to connect the battery cell 10 to the electrode terminal of the battery pack.

As another example, if the state of battery cell 10 is a defective state due to overdischarge, the control unit 200 may maintain the operation state of the discharge switch 31 as a turn-off state.

As another example, if the state of battery cell 10 is an overcharge state and/or a high-temperature state, the control unit 200 may control the operation state of the discharge switch 31 to a turn-on state. Specifically, if the state of battery cell 10 is a defective state due to overcharge and/or high temperature, the control unit 200 may determine whether the SOC of the battery cell 10 is in a dangerous level. As in the previous example, if the SOC of the battery cell 10 is 70% or above, the control unit 200 may determine that the SOC of the battery cell 10 is in a dangerous level. If the SOC of the battery cell 10 is in a dangerous level, the control unit 200 may discharge the battery cell 10 by controlling the operation state of the discharge switch 31 to a turn-on state.

That is, the apparatus for detecting a defect of a battery pack according to an embodiment of the present disclosure may additionally check the state of the battery cell 10 in an exceptional situation, for example when the fuse 20 is cut by an external factor. Accordingly, it may be prevented that the battery cell 10 in a normal state is determined as in a defective state due to an exception situation. In addition, there is an advantage that the battery cell 10 may be more flexibly handled in an exceptional situation.

Figure 3:
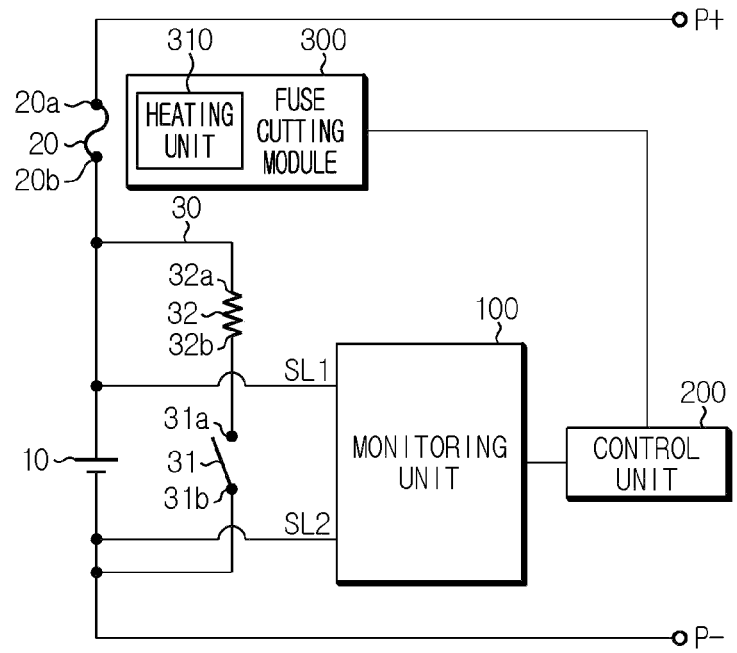
FIGS. 3 to 5 are diagrams schematically showing still another exemplary configuration of the apparatus for detecting a defect of a battery pack according to an embodiment of the present disclosure.
Figure 4:
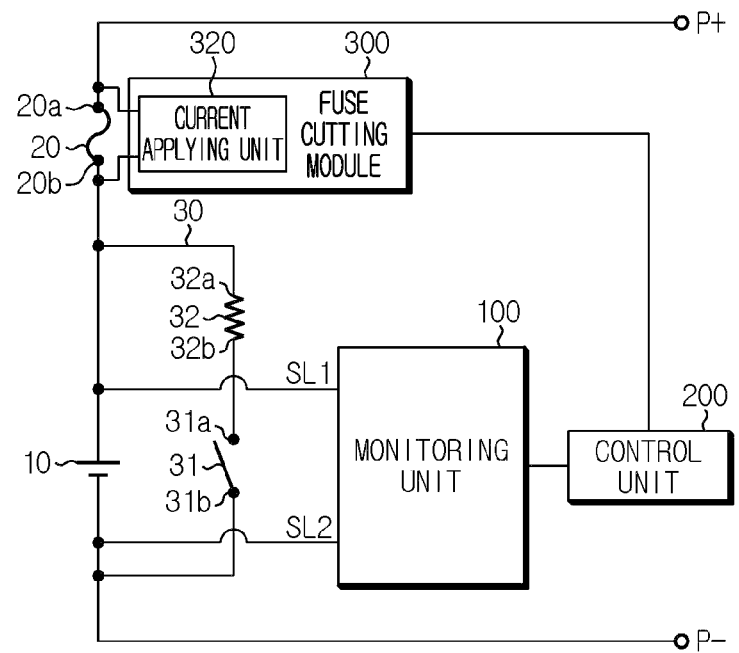
Figure 5:
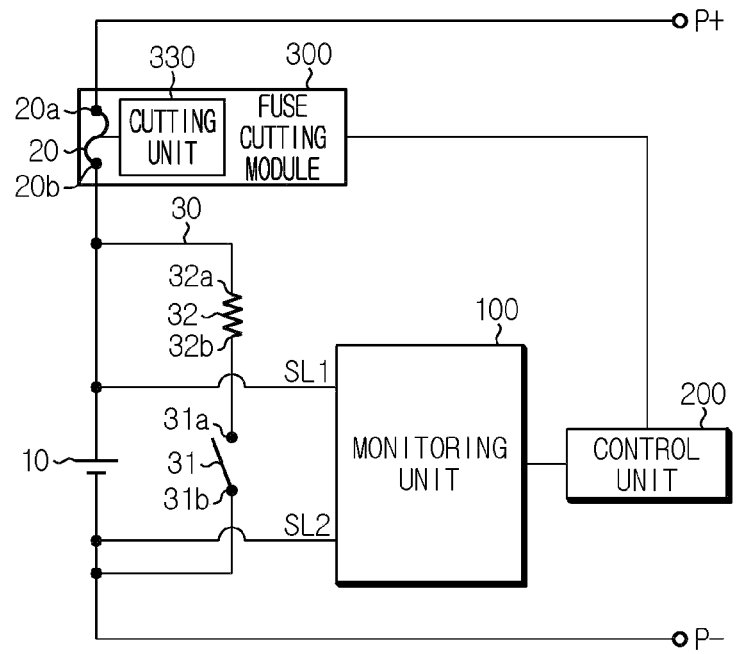

FIGS. 3 to 5 are diagrams schematically showing still another exemplary configuration of the apparatus for detecting a defect of a battery pack according to an embodiment of the present disclosure. Hereinafter, various embodiments for actively cutting the fuse 20 will be described with reference to FIGS. 3 to 5.

Referring to FIGS. 3 to 5, the apparatus for detecting a defect of a battery pack according to an embodiment of the present disclosure may further include a fuse cutting module 300 configured to cut the fuse 20. That is, FIGS. 3 to 5 may be regarded as diagrams for illustrating an embodiment in which the fuse cutting module 300 is further included in the apparatus for detecting a defect of a battery pack as shown in FIG. 1.

The fuse cutting module 300 is connected to the control unit 200, and may be configured to include at least one of a heating unit 310 configured to generate heat if a cutting control signal is received from the control unit 200, a current applying unit 320 configured to apply a current to the fuse 20, and a cutting unit 330 configured to cut the fuse 20, in order to cut the fuse 20. Here, the cutting control signal is a signal that the control unit 200 sends to the fuse cutting module 300 to cut the fuse 20.

For example, referring to FIG. 3, the fuse cutting module 300 may include a heating unit 310. The heating unit 310 may be operated if the fuse cutting module 300 receives a cutting control signal from the control unit 200. In this case, the heating unit 310 of the fuse cutting module 300 is fixed at a position very close to the fuse 20, and the fuse 20 may be melted and cut by the heat generated by the heating unit 310.

As another example, referring to FIG. 4, the fuse cutting module 300 may include a current applying unit 320. In this case, the fuse cutting module 300 may be connected to one end 20*b* and the other end 20*a* of the fuse 20, respectively. If the fuse cutting module receives a cutting control signal from the control unit 200, the current applying unit 320 may apply a current to the fuse 20 to cut the fuse 20. The current applying unit 320 of the fuse cutting module 300 may receive power from a separate power source provided therein, an external power source, or the battery cell 10.

As another example, referring to FIG. 5, the fuse 20 may be placed on the fuse cutting module 300 and fixedly coupled thereto. The fuse cutting module 300 may include a cutting unit 330 to cut the body, one end 20*b* or the other end 20*a* of the fuse 20 when receiving a cutting control signal.

For example, a terminal of the fuse 20 may be inserted into a groove provided at the cutting unit 330. If the fuse cutting module 300 receives a cutting control command from the control unit 200, the size of the groove of the cutting unit into which the terminal of the fuse 20 is inserted is reduced, so the terminal of the fuse 20 may be cut.

As another example, the cutting unit 330 may be configured to have a plate-like structure for cutting the terminal or body of the fuse 20. The cutting unit 330 is configured to be movable inside the fuse cutting module 300. Thus, if the fuse cutting module 300 receives a cutting control command from the control unit 200, the cutting unit 330 may be moved to cut the terminal or body of the fuse 20.

Preferably, the control unit 200 may be configured to output the cutting control signal, if the fuse 20 is not cut and the state of the battery cell 10 is determined as a defective state.

For example, if the fuse 20 is cut by an external impact or overcurrent introduced from the outside, the control unit 200 may not output a cutting control signal. In addition, even when the battery cell 10 is in a normal state, the control unit 200 may not output a cutting control signal.

Accordingly, the control unit 200 may output a cutting control signal to the fuse cutting module 300 only when the fuse 20 is not cut and the battery cell 10 is in a defective state.

That is, the apparatus for detecting a defect of a battery pack according to an embodiment of the present disclosure may directly cut the fuse 20 through the fuse cutting module 300, so there is an advantage of securely disconnecting the connection between the battery cell 10 in a defective state and the electrode terminal of the battery pack. Accordingly, various problems caused when the battery cell 10 in a defective state is connected to the outside may be prevented in advance.

Figure 6:
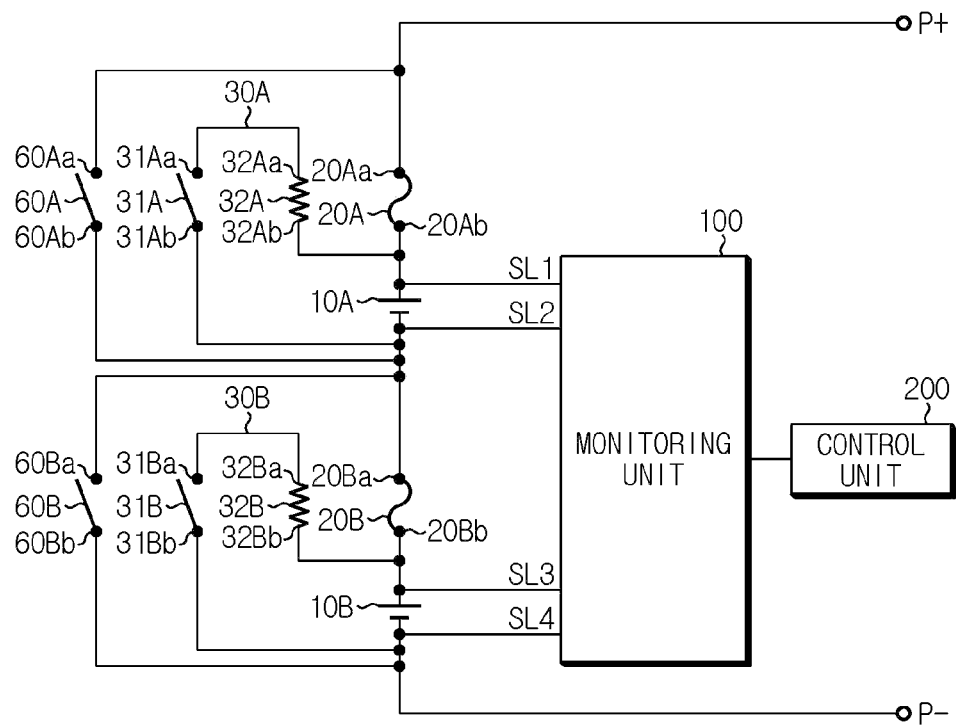
FIG. 6 is a diagram schematically showing an exemplary configuration of an apparatus for detecting a defect of a battery pack according to another embodiment of the present disclosure.

FIG. 6 is a diagram schematically showing an exemplary configuration of an apparatus for detecting a defect of a battery pack according to another embodiment of the present disclosure.

The battery pack may include a plurality of battery cells 10A and 10B. For example, the plurality of battery cells 10A and 10B may be connected in series and/or in parallel. Hereinafter, for convenience of description, an embodiment of a battery pack in which the first battery cell 10A and the second battery cell 10B are connected in series will be described.

The fuse 20A and 20B may be provided in plural, and the plurality of fuses 20A and 20B may be configured to correspond to the plurality of battery cells 10A and 10B included in the battery pack, respectively. In addition, each of the fuses 20A and 20B may be configured to be connected to one side of the corresponding battery cell 10A and 10B, such as the first terminal thereof.

That is, the first fuse 20A may correspond to the first battery cell 10A, and the second fuse 20B may correspond to the second battery cell 10B. For example, in the embodiment of FIG. 6, one end 20A*b* of the first fuse 20A may be connected to the first terminal of the first battery cell 10A. The other end 20B*a* of the second fuse 20B may be connected to the second terminal of the first battery cell 10A, and the one end 20Bb of the second fuse 20B may be connected to the first terminal of the second battery cell 10B. The other end 20Aa of the first fuse 20A may be connected to the positive electrode terminal (P+) of the battery pack, and the second terminal of the second battery cell 10B may be connected to the negative electrode terminal (P−) of the battery pack.

The discharge line 30A and 30B may be provided in plural, and the plurality of discharge lines 30A and 30B may be configured to correspond to the plurality of battery cells 10A and 10B, respectively. In addition, the discharge lines 30A and 30B respectively includes discharge resistors 32A and 32B and discharge switches 31A and 31B, and may be configured to be connected in parallel to the corresponding battery cells 10A and 10B, respectively.

For example, in the embodiment of FIG. 6, the first discharge line 30A may correspond to the first battery cell 10A, and the second discharge line 30B may correspond to the second battery cell 10B. Specifically, the first discharge line 30A may include a first discharge resistor 32A and a first discharge switch 31A, and the second discharge line 30B may include a second discharge resistor 32B and a second discharge switch 31B. Here, if a current is applied to the first discharge line 30A, the first fuse 20A may be cut by the heat generated from the first discharge line 30A. Likewise, if a current is applied to the second discharge line 30B, the second fuse 20B may be cut by the heat generated in the second discharge line 30B.

One end 32Ab of the first discharge resistor 32a may be connected to a line connecting the first fuse 20A and the first terminal of the first battery cell 10A, and the other end 32Aa of the first discharge resistor 32a may be connected to the other end 31Aa of the first discharge switch 31A. One end 31Ab of the first discharge switch 31A may be connected to a line connecting the second terminal of the first battery cell 10A and the other end 20Ba of the second fuse 20B. Specifically, one end 32Ab of the first discharge resistor 32a may be connected to a line connecting one end 20Ab of the first fuse 20A and the first terminal of the first battery cell 10A. One end 31Ab of the first discharge switch 31A may be connected to a line connecting the second terminal of the first battery cell 10A and the other end 20Ba of the second fuse 20B.

One end 32Bb of the second discharge resistor 32B may be connected to a line connecting the first terminal of the second battery cell 10B and one end 20Bb of the second fuse 20B, and the other end 32Ba of the second discharge resistor 32B may be connected to the other end 31Ba of the second discharge switch 31B. One end 31Bb of the second discharge switch 31B may be connected to a line connecting the second terminal of the second battery cell 10B and the negative electrode terminal (P−) of the battery pack. Specifically, one end of the second discharge resistor 32B may be connected to a line connecting one end 20Bb of the second fuse 20B and the first terminal of the second battery cell 10B.

The apparatus for detecting a defect of a battery pack according to another embodiment of the present disclosure may further include bypass switches 60A and 60B.

Referring to FIG. 6, the bypass switch 60A and 60B may be provided in plural, and the plurality of bypass switches 60A and 60B may be configured to correspond to the plurality of battery cells 10A and 10B, respectively. The bypass switch 60A includes a first end 60Ba and a second end 60Bb, and the bypass switch 60B includes a first end 60Ba and a second end 60Bb. In addition, each of the bypass switches 60A and 60B may be connected in parallel to each of the corresponding battery cells 10A and 10B. That is, the first bypass switch 60A may be connected in parallel to the first battery cell 10A, and the second bypass switch 60B may be connected in parallel to the second battery cell 10B. At this time, it may be regarded that the bypass line on which each of the bypass switches 60A and 60B is installed is configured to be connected in parallel to each of the discharge lines 30A and 30B. Moreover, the bypass line in which each of the bypass switches 60A and 60B is installed may be configured to bypass all of the battery cells 10A and 10B and the fuses 20A and 20B.

In addition, the bypass switches 60A and 60B may be configured such that the operation state thereof is controlled to a turn-off state or a turn-on state by the control unit 200. In a general situation, the operation state of the bypass switches 60A and 60B may be a turn-off state, similar to the operation state of the discharge switches 31A and 31B. After that, if the connection between the corresponding battery cells 10A and 10B and the battery pack is disconnected, the operation state of the bypass switches 60A and 60B may be controlled to a turn-on state.

For example, in the embodiment of FIG. 6, it is assumed that the first fuse 20A is cut off, the first battery cell 10A is in a defective state, and the second battery cell 10B is in a normal state. In this case, the connection between the positive electrode terminal (P+) of the battery pack to the first battery cell 10A and the second battery cell 10B may be disconnected. Therefore, in order to connect the second battery cell 10B in a normal state to the positive electrode terminal (P+) of the battery pack, the control unit 200 may control the operation state of the first bypass switch 60A to a turn-on state. The first terminal of the second battery cell 10B may be connected to the positive electrode terminal (P+) of the battery pack through the second fuse 20B and the first bypass switch 60A, and the second terminal of the second battery cell 10B may be connected to the negative electrode terminal (P−) of the battery pack.

That is, since the apparatus for detecting a defect of a battery pack according to another embodiment of the present disclosure further includes a plurality of bypass switches 60A and 60B, it is possible to selectively disconnect the connection between the battery cell in a defective state among the plurality of battery cells 10A and 10B and the electrode terminal of the battery pack. Therefore, the battery pack may be used longer, and it is possible to prevent the battery pack being entirely unusable due to a defect in some battery cells.

The control unit 200 may select a battery cell, which is determined as in a defective state or as a fuse 20A and 20B corresponding thereto is cut, among the plurality of battery cells 10A and 10B as a target cell.

Here, the monitoring unit 100 may measure at least one of voltage, current and temperature of each of the plurality of battery cells 10A and 10B through the sensing lines respectively connected to the plurality of battery cells 10A and 10B. In addition, the monitoring unit 100 may determine whether the fuses 20A and 20B respectively corresponding to the plurality of battery cells 10A and 10B are cut or not.

For example, seeing the embodiment shown in FIG. 6, the monitoring unit 100 may monitor the first battery cell 10A through the first sensing line SL1 and the second sensing line SL2. In addition, the monitoring unit 100 may monitor the second battery cell 10B through the third sensing line SL3 and the fourth sensing line SL4. As in the former embodiment, if the second fuse 20B is cut and the operation state of the second bypass switch 60B is controlled to a turn-on state, the current output from the second battery cell 10B is not applied to the second sensing line SL2, so the voltage or the like of the second battery cell 10B may not be measured through the second sensing line SL2 and the fourth sensing line SL4. Accordingly, the monitoring unit 100 may monitor the corresponding battery cells 10A and 10B through the sensing lines provided at both ends of each of the battery cells 10A and 10B.

The control unit 200 may control the operation state of the discharge switch included in the discharge line corresponding to the selected target cell to a turn-on state or a turn-off state according to the state of the selected target cell.

For example, if the target cell is in an overcharged defective state, the control unit 200 may control the operation state of the discharge switch corresponding to the target cell to a turn-on state.

Seeing the embodiment shown in FIG. 6, if the first fuse 20A is cut and the first battery cell 10A is selected as a target cell, the control unit 200 may determine the state of the first battery cell 10A. If it is determined that the state of the first battery cell 10A is a defective state, the control unit 200 may control the operation state of the first discharge switch 31A to a turn-on state.

The control unit 200 may be configured to control the operation state of the bypass switch connected in parallel to the target cell to a turn-on state.

As in the former embodiment, if the operation state of the first discharge switch 31A is controlled to a turn-on state, the control unit 200 may control the operation state of the first bypass switch 60A to a turn-on state in order to connect the positive electrode terminal (P+) of the battery pack and the second battery cell 10B.

The apparatus for detecting a defect of a battery pack according to another embodiment of the present disclosure has an advantage of allowing the battery pack to be used longer by selectively disconnecting the battery pack and the target cell. In addition, there is an advantage that secondary accidents caused by the target cell in a defective state can be prevented in advance.

Figure 7:
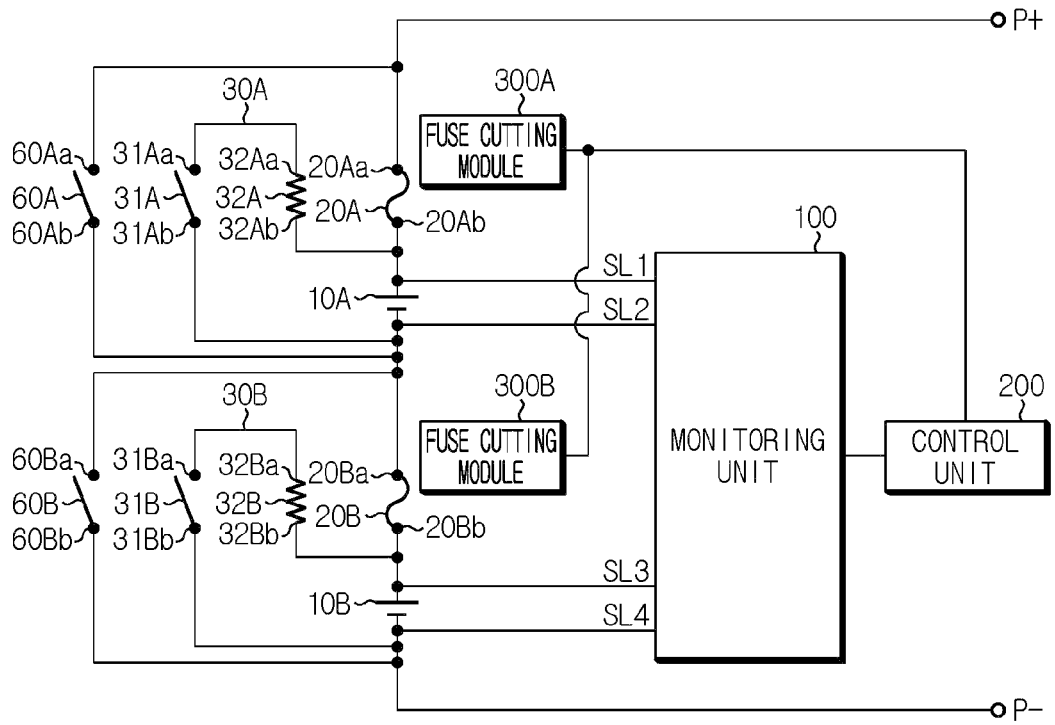
FIG. 7 is a diagram schematically showing another exemplary configuration of the apparatus for detecting a defect of a battery pack according to another embodiment of the present disclosure.

FIG. 7 is a diagram schematically showing another exemplary configuration of the apparatus for detecting a defect of a battery pack according to another embodiment of the present disclosure.

The apparatus for detecting a defect of a battery pack according to another embodiment of the present disclosure may further include a plurality of fuse cutting modules 300A and 300B respectively corresponding to the plurality of fuses 20A and 20B.

For example, in the embodiment shown in FIG. 7, the apparatus for detecting a defect of a battery pack may further include a first fuse 20A cutting unit 300A corresponding to the first fuse 20A and a second fuse 20B cutting unit 300B corresponding to the second fuse 20B. Both the first fuse 20B cutting unit 300A and the second fuse 20B cutting unit 300B are connected to the control unit 200 and may receive a cutting control command from the control unit 200. Only the fuse cutting module receiving the cutting control command from the control unit 200 may be operated to cut the corresponding fuse.

Figure 8:
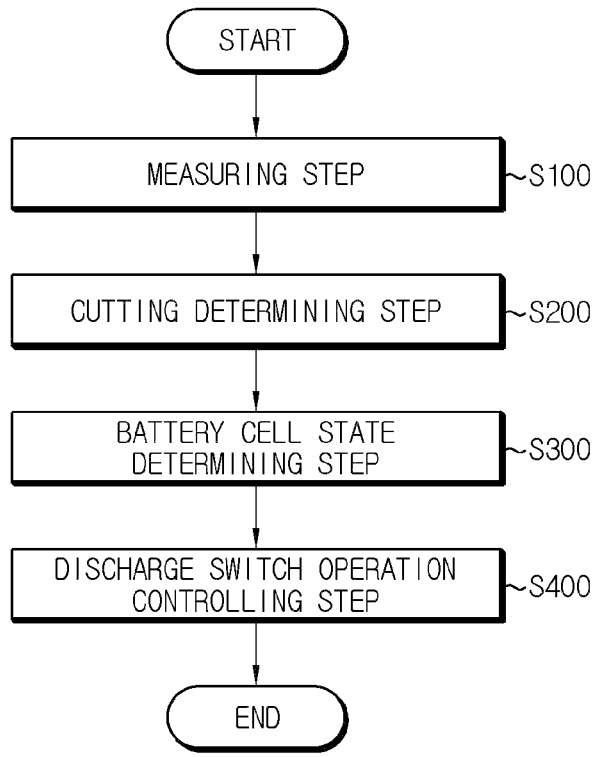
FIG. 8 is a diagram schematically showing a method for detecting a defect of a battery pack according to still another embodiment of the present disclosure.

FIG. 8 is a diagram schematically showing a method for detecting a defect of a battery pack according to still another embodiment of the present disclosure. The method for detecting a defect of a battery pack according to still another embodiment of the present disclosure may be performed by the apparatus for detecting a defect of a battery pack as described above.

Referring to FIG. 8, the method for detecting defects of the battery pack according to still another embodiment of the present disclosure may include a measuring step (S100), a cutting determining step (S200), a battery cell state determining step (S300), and a discharge switch operation controlling step (S400).

The measuring step (S100) is a step of measuring at least one of voltage, current and temperature of the battery cell 10, and may be performed by the monitoring unit 100.

The monitoring unit 100 may monitor the battery cell 10 by measuring the voltage, current and temperature for each battery cell 10.

The cutting determining step (S200) is a step of determining whether the fuse 20 is cut or not, and may be performed by the monitoring unit 100, similar to the measuring step (S100).

For example, the monitoring unit 100 may determine whether the fuse 20 is cut or not by measuring the voltage at both ends of the fuse 20, or may determine whether the fuse 20 is cut or not based on the current measured by a voltmeter as in the embodiment of FIG. 2.

The battery cell state determining step (S300) is a step of determining the state of the battery cell 10 as a normal state or a defective state based on the measurement result measured in the measuring step (S100), and may be performed by the control unit 200.

The control unit 200 may receive the measurement result from the monitoring unit 100. In addition, the control unit 200 may estimate the SOC of the battery cell 10 based on the received measurement result.

The control unit 200 may determine the state of the battery cell 10 as a defective state if the estimated SOC of the battery cell 10 is lower than or equal to the preset lower limit value or greater than or equal to the preset upper limit value. In addition, the control unit 200 may determine the state of the battery cell 10 as a defective state if the temperature of the battery cell 10 in the measurement results received from the monitoring unit 100 is higher than or equal to a predetermined threshold temperature.

The discharge switch operation controlling step (S400) is a step of controlling the operation state of the discharge switch 31 to a turn-on state or a turn-off state according to the determined state of the battery cell 10 and the determination result on whether the fuse 20 is cut, and may be performed by the control unit 200.

If the fuse 20 is already cut, the control unit 200 may control the operation state of the discharge switch 31 according to the state of the battery cell 10. For example, if the battery cell 10 is overcharged and the state of the battery cell 10 is determined as a defective state, the control unit 200 may control the operation state of the discharge switch 31 to a turn-on state in order to lower the energy in the battery cell 10. As another example, if the battery cell 10 is overdischarged and the state of the battery cell 10 is determined as a defective state, the control unit 200 may maintain the operation state of the discharge switch 31 as a turn-off state so that the battery cell 10 is not discharged any longer.

As another example, if the temperature of battery cell 10 rises to a proper temperature or above and the state of the battery cell 10 is determined as a defective state, the control unit 200 may maintain the operation state of the discharge switch 31 as a turn-off state and lower the temperature of the battery cell 10. In addition, the control unit 200 may control the operation state of the discharge switch 31 to a turn-on state to operate the cooling unit provided on the discharge line 30 so that the temperature of the battery cell 10 is lowered.

Even when the fuse 20 is not cut, the control unit 200 may control the operation state of the discharge switch 31 according to the state of the battery cell 10.

For example, if the battery cell 10 is overcharged and the state of the battery cell 10 is determined as a defective state, the control unit 200 may control the operation state of the discharge switch 31 to a turn-on state in order to lower the energy in the battery cell 10 while cutting the fuse 20. In this case, the fuse 20 may be cut by the heat generated by the discharge resistor 32 provided on the discharge line 30.

As another example, if the battery cell 10 is overdischarged and the state of the battery cell 10 is determined as a defective state, the control unit 200 may control the operation state of the discharge switch 31 to a turn-on state to cut the fuse 20, and then control the operation state of the discharge switch 31 to a turn-off state so that the battery cell 10 is not discharged any longer.

As another example, if the battery cell 10 is overdischarged and the state of the battery cell 10 is determined as a defective state, the control unit 200 may maintain the operation state of the discharge switch 31 as a turn-off state so that the battery cell 10 is not discharged any longer, and then output a cutting control command to the fuse cutting module 300. The fuse 20 may be cut by the fuse cutting module 300 receiving the cutting control command.

As still another example, if the temperature of battery cell 10 rises and the state of the battery cell 10 is determined as a defective state, the control unit 200 may control the operation state of the discharge switch 31 to a turn-on state to cut the fuse 20. After that, the control unit 200 may control the operation state of the discharge switch 31 to a turn-off state to lower the temperature of the battery cell 10, or maintain the operation state of the discharge switch 31 as a turn-on state to operate the cooling unit provided on the discharge line 30 so that the temperature of the battery cell 10 is lowered.

A battery pack according to an embodiment of the present disclosure may include the apparatus for detecting a defect of a battery pack according to the present disclosure described above. For example, as shown in FIG. 1, the battery pack may include the battery cell 10 and the apparatus for detecting a defect of a battery pack. In addition, the battery pack according to the present disclosure may include electronic equipment (including a BMS, a relay, a fuse 20, and the like) and a pack case, in addition to the apparatus for detecting a defect of a battery pack.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

10: battery cell
20: fuse
30: discharge line
31: discharge switch
32: discharge resistor
33: cut-off resistor
40: main switch
50: ammeter
100: monitoring unit
200: control unit
300: fuse cutting module
310: heating unit
320: current applying unit
330: cutting unit

What is claimed is:

1. An apparatus for detecting a defect of a battery pack including a battery cell, comprising:
   a fuse having a first end connected to a first terminal of the battery cell in series and a second end connected to an electrode terminal of the battery pack;
   a monitor configured to measure at least one of voltage, current and temperature of the battery cell and determine whether the fuse is cut or remains intact;
   a discharge line including:
      a discharge resistor having a first end connected between the first end of the fuse and the first terminal of the battery cell; and
      a discharge switch having a first end connected to a second terminal of the battery cell and a second end connected to a second end of the discharge resistor; and
   a controller configured to:
      receive a measurement result measured by the monitor and a determination result on whether the fuse is cut is not,
      estimate a state of charge (SOC) of the battery cell based on the received measurement result,
      determine based on the received measurement result and the estimated SOC whether a state of the battery cell is a normal state or a defective state, and
      control an operation state of the discharge switch to a turn-on state or a turn-off state according to the determined state of the battery cell and the determination result on whether the fuse is cut or not.

2. The apparatus according to claim 1,
wherein the fuse is configured to be cut when the operation state of the discharge switch is a turn-on state, and
the controller is configured to determine that the state of the battery cell is a defective state and control the operation state of the discharge switch to a turn-on state, in response to the battery cell being determined based on the measurement result as being in at least one of an overcharge state and a high-temperature state higher than or equal to a threshold temperature.

3. The apparatus according to claim 2, further comprising:
a cooling element connected on the discharge line in series and configured to be operated to lower the temperature of the battery cell while the operation state of the discharge switch is being controlled to a turn-on state by the controller.

4. The apparatus according to claim 1,
wherein the controller is configured to control the operation state of the discharge switch to a turn-off state, in response to the fuse being cut and the estimated SOC of the battery cell being lower than or equal to a preset lower limit value.

5. The apparatus according to claim 4,
wherein the controller is configured to control the operation state of the discharge switch to a turn-on state, in response to the estimated SOC of the battery cell being higher than or equal to a preset upper limit value after the fuse is determined as being cut.

6. The apparatus according to claim 1, further comprising:
a main switch having a first end connected to a first end of the fuse and a second end connected to the electrode terminal of the battery pack; and
a cut-off resistor having a first end connected between the fuse and the main switch and a second end connected between the discharge resistor and the discharge switch.

7. The apparatus according to claim 6,
wherein the discharge resistor is configured to have a resistance smaller than that of the cut-off resistor.

8. The apparatus according to claim 6,
wherein the controller is configured to control the operation state of the main switch to a turn-off state, in response to the state of the battery cell being determined as a defective state.

9. The apparatus according to claim 6, further comprising:
an ammeter provided between the first end of the discharge resistor and a line to which the second end of the fuse and the first terminal of the battery cell are connected and configured to measure a current flowing in the discharge resistor,
wherein the monitor is configured to determine that the fuse is cut, in response to the current value measured by the ammeter being higher than or equal to a predetermined threshold value.

10. The apparatus according to claim 9,
wherein the controller is configured to control the operation state of the main switch to a turn-on state, in response to the fuse being determined by the monitor as being cut, regardless of whether the battery cell is determined as a normal state.

11. The apparatus according to claim 1, further comprising:
a fuse cutting module connected to the controller and configured to cut the fuse by including at least one of a heater for generating heat, a current applicator for applying a current to the fuse and a cutter for cutting the fuse when a cutting control signal is received from the controller,
wherein the controller is configured to output the cutting control signal, in response to the fuse not being cut and the state of the battery cell being determined as a defective state.

12. The apparatus according to claim 1,
wherein the battery pack includes a plurality of battery cells,
the fuse is configured to be connected to the first terminal of a corresponding battery cell among the plurality of battery cells included in the battery pack,
the discharge line is configured to be connected to each corresponding battery cell among the plurality of battery cells, and
the apparatus further comprises a bypass switch connected in parallel to each corresponding battery cell among the plurality of battery cells and configured such that an operation state of the bypass switch is controlled to a turn-off state or a turn-on state by the controller.

13. The apparatus according to claim 12,
wherein the controller is configured to select a battery cell, among the plurality of battery cells, as a target cell, which is determined as in a defective state or as a fuse corresponding thereto as being cut, control the operation state of the discharge switch included in the discharge line corresponding to the selected target cell to a turn-on state or a turn-off state according to the state of the selected target cell, and control the operation state of the bypass switch connected to the target cell in parallel to a turn-on state.

14. A battery pack, comprising the apparatus for detecting a defect of a battery pack according to claim 1.

15. A method for detecting a defect of a battery pack, comprising:
a measuring step of measuring at least one of voltage, current and temperature of a battery cell of the battery pack;
a cutting determining step of determining whether a fuse is cut or remains intact, wherein the fuse has a first end connected to a first terminal of the battery cell in series and a second end connected to an electrode terminal of the battery pack;
a battery cell state determining step of determining a state of the battery cell as a normal state or a defective state based on the measurement result measured in the measuring step; and
a discharge switch operation controlling step of controlling an operation state of a discharge switch to a turn-on state or a turn-off state according to the determined state of the battery cell and the determination result on whether the fuse is cut or not,
wherein the discharge switch has a first end connected to a second terminal of the battery cell and a second end connected to a second end of a discharge resistor, and
wherein the discharge resistor has a first end connected between the first end of the fuse and the first terminal of the battery cell.

\* \* \* \* \*